(12) United States Patent
Mutsuura (10) Patent No.: US 10,211,748 B2
(45) Date of Patent: Feb. 19, 2019

(54) CONTROL BOARD OF POWER CONVERSION DEVICE CAPABLE OF PREVENTING NOISE FROM BEING EMITTED TO THE OUTSIDE

(71) Applicant: AISIN AW CO., LTD., Anjo-shi, Aichi-ken (JP)

(72) Inventor: Keita Mutsuura, Miyoshi (JP)

(73) Assignee: AISIN AW CO., LTD., Anjo (JP)

( * ) Notice: Subject to any disclaimer, the term of this patent is extended or adjusted under 35 U.S.C. 154(b) by 12 days.

(21) Appl. No.: 15/509,349

(22) PCT Filed: Aug. 10, 2015

(86) PCT No.: PCT/JP2015/072699
§ 371 (c)(1),
(2) Date: Mar. 7, 2017

(87) PCT Pub. No.: WO2016/047299
PCT Pub. Date: Mar. 31, 2016

(65) Prior Publication Data
US 2017/0279360 A1 Sep. 28, 2017

(30) Foreign Application Priority Data

Sep. 24, 2014 (JP) .................................. 2014-194264

(51) Int. Cl.
*H02M 7/00* (2006.01)
*H02M 3/338* (2006.01)
(Continued)

(52) U.S. Cl.
CPC ........... *H02M 3/3382* (2013.01); *H02M 1/32* (2013.01); *H02M 3/335* (2013.01);
(Continued)

(58) Field of Classification Search
CPC .. H02M 1/32; H02M 3/3382; H02M 7/53846; H03K 17/0828
See application file for complete search history.

(56) References Cited

U.S. PATENT DOCUMENTS 8,093,852 B2   1/2012 Nakamura et al.
2009/0174353 A1*  7/2009 Nakamura .......... B60L 11/1868
                                                    318/400.27
(Continued)

FOREIGN PATENT DOCUMENTS

JP    H11-68313 A      3/1999
JP    2009-130967 A    6/2009
(Continued)

OTHER PUBLICATIONS

Oct. 27, 2015 Search Report issued in International Patent Application No. PCT/JP2015/072699.

*Primary Examiner* — Jeffrey Gblende
*Assistant Examiner* — David A. Singh
(74) *Attorney, Agent, or Firm* — Oliff PLC (57) ABSTRACT

A control board of a power conversion device, the control board includes a board main body, a plurality of drive circuits, a power source control circuit, an insulation region, a plurality of insulation transformers, and a connecting line that electrically connects the plurality of insulation transformers and the power source control circuit to each other, and at least a part of which extends in a region in inner layers of the board main body that overlaps the insulation region when viewed in a perpendicular direction with respect to the surface of the board main body.

8 Claims, 8 Drawing Sheets (51) Int. Cl.
    *H02M 1/32*       (2007.01)
    *H02M 3/335*      (2006.01)
    *H02M 7/53846*    (2007.01)
    *H03K 17/082*     (2006.01)
    *H05K 1/02*       (2006.01)

(52) U.S. Cl.
    CPC ....... *H02M 3/33507* (2013.01); *H02M 7/003* (2013.01); *H02M 7/53846* (2013.01); *H03K 17/0828* (2013.01); *H05K 1/0263* (2013.01); *H05K 1/0298* (2013.01); *H05K 2201/10022* (2013.01); *H05K 2201/10053* (2013.01); *H05K 2201/10166* (2013.01)

(56) References Cited

U.S. PATENT DOCUMENTS

| 2011/0199800 | A1  | 8/2011  | Yahata et al. |
| 2014/0232181 | A1* | 8/2014  | Tsuji ................ H02M 7/003 307/10.1 |
| 2015/0364984 | A1* | 12/2015 | Miyauchi ............ H03K 17/567 363/132 |

FOREIGN PATENT DOCUMENTS

| JP | 2013-021799 A | 1/2013 |
| WO | 2010/038541 A1 | 4/2010 |

* cited by examiner

CONTROL BOARD OF POWER CONVERSION DEVICE CAPABLE OF PREVENTING NOISE FROM BEING EMITTED TO THE OUTSIDE

BACKGROUND

The present disclosure relates to a control board of a power conversion device.

There has been known a motor control device in which a low-voltage circuit region including a power source control circuit and each of high-voltage circuit regions having a drive circuit provided with respect to each of arms of an inverter circuit for supplying an electric current to an alternating current motor are connected to each other by transformers in an insulated state, and in which only one power source control circuit is commonly provided for all of the transformers so as to collectively control voltage applied to each of the transformers. (For example, refer to Japanese Patent Application Publication No. 2009-130967) In addition, in this motor control device, the power source control circuit adopts a push-pull type configuration.

SUMMARY

In a power source control circuit disclosed in the above-mentioned Japanese Patent Application Publication No. 2009-130967, however, transformers are driven by switching transistors. Therefore, there is a concern that a noise generated from a drive line may cause a problem.

An exemplary aspect of the present disclosure provides a control board of a power conversion device capable of preventing the noise generated from the drive line that drives the transformers in the power source control circuit from being emitted to the outside.

According to an aspect of the present disclosure, a control board of a power conversion device is provided, the control board includes: a board main body that is a multi-layer board; a plurality of drive circuits that is mounted on a surface of the board main body, each of which is provided with respect to each of arms of the power conversion device, and that drives a switching element included in the corresponding arm; a power source control circuit that is mounted on the surface of the board main body, an insulation region that is formed on the surface of the board main body, and that insulates the power source control circuit and the plurality of drive circuits from each other; a plurality of insulation transformers, each of which is provided with respect to each of the plurality of drive circuits, that is disposed on the surface of the board main body so as to cross the insulation region, and that each connects the power source control circuit and the corresponding drive circuit to each other in an insulated state; and a connecting line that electrically connects the plurality of insulation transformers and the power source control circuit to each other, and at least a part of which extends in a region in inner layers of the board main body that overlaps the insulation region when viewed in a perpendicular direction with respect to the surface of the board main body.

According to the present disclosure, it is possible to provide the control board of the power conversion device capable of preventing the noise generated from the drive line that drives the transformers in the power source control circuit from being emitted to the outside.

BRIEF DESCRIPTION OF THE DRAWINGS

FIG. 4 is a perspective view that shows P part of FIG. 2.

FIG. 7 is a perspective view that shows Q part of FIG. 2.

DETAILED DESCRIPTION OF EMBODIMENTS

Each of embodiments will be described in detail below with reference to accompanying drawings.

Figure 1:
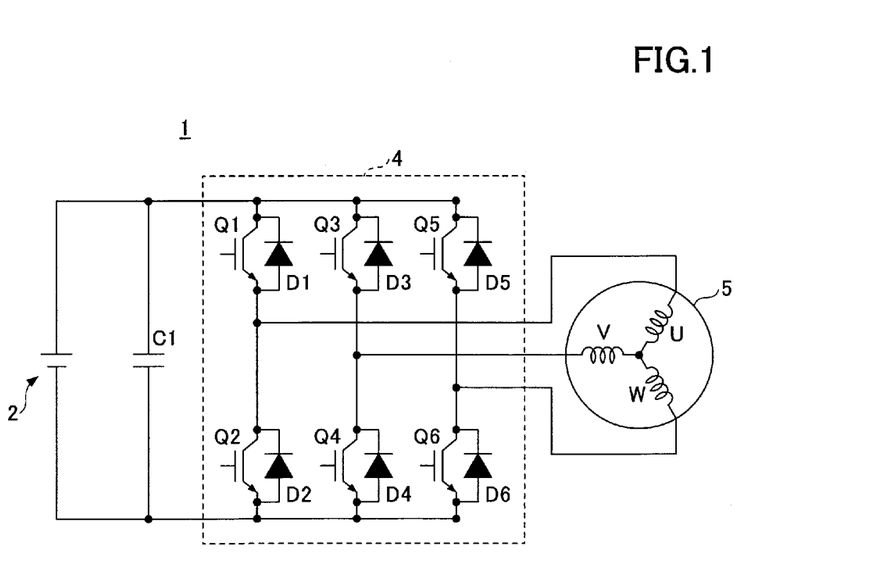
FIG. 1 is a view that shows an example of an electric circuit including an inverter.

FIG. 1 is a view that shows an example of an electric circuit 1 including an inverter 4. The electric circuit 1 is, for example, for driving a motor.

The electric circuit 1 includes a battery 2, the inverter 4 (one example of a power conversion device), and a smooth capacitor C1. A motor 5 is electrically connected to the inverter 4. The motor 5 may be a motor for travelling that is used for a hybrid vehicle or an electric vehicle. In this example, the motor 5 is a three-phase alternating current motor. The smooth capacitor C1 is electrically connected to the battery 2 in a position between a positive electrode and a negative electrode.

The inverter 4 is provided with a plurality of switching elements Q1 to Q6. The switching elements Q1 to Q6 are IGBT (Insulated Gate Bipolar Transistor). However, the switching elements Q1 to Q6 may be other switching elements, such as MOSFET (Metal Oxide Semiconductor Field-Effect Transistor), instead of the IGBT. The inverter 4 may be provided with freewheeling diodes D1 to D6 in parallel to the respective switching elements Q1 to Q6.

In addition, in the example shown in FIG. 1, a DC-DC converter (another example of the power conversion device) may be provided between the smooth capacitor C1 and the battery 2.

Figure 2:
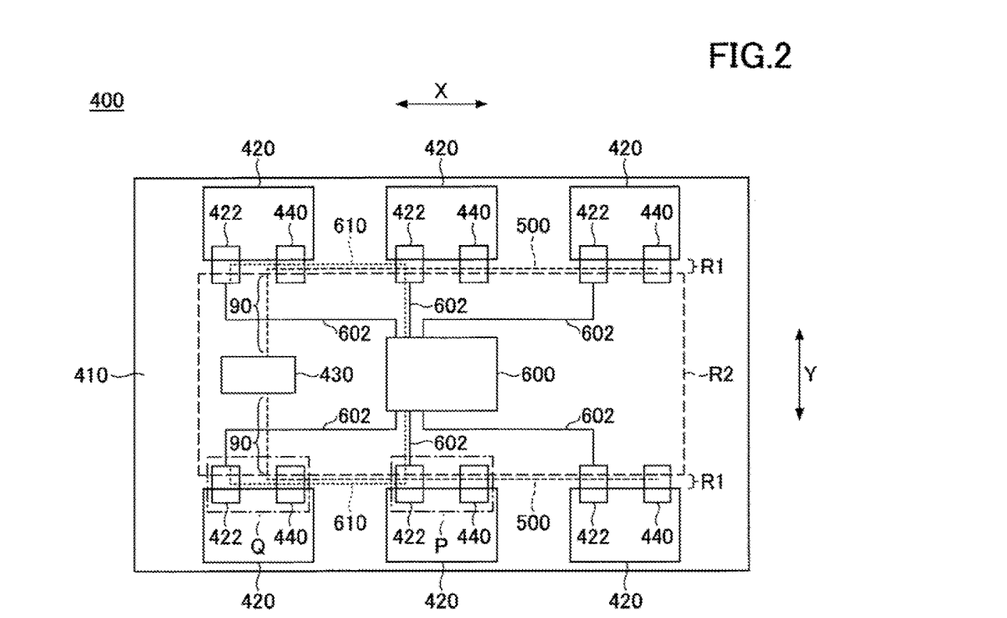
FIG. 2 is a top view that shows general configuration of a control board of the inverter according to the example.

FIG. 2 is a top view that shows general configuration of a control board 400 of the inverter 4 according to the example. Hereinafter, for the purpose of convenience of explanation, FIG. 2 is defined as a plane view seen from upward, in regard to up/down direction. However, a direction in a state in which the control board 400 of the inverter 4 is mounted is optional. Besides, X direction and Y direction are defined as shown in FIG. 2.

The control board 400 of the inverter 4 includes a board main body 410, a plurality of drive circuits 420, a power source control circuit 430, a plurality of insulation transformers 440, a connecting line 500, and a microcomputer (hereafter mentioned as "micro") 600.

The board main body 410 is a multi-layer board. The board main body 410 preferably includes inner layers more than four layers.

The plurality of drive circuits 420 is mounted on a surface (A face) on an upper side of the board main body 410. Each of the drive circuits 420 is provided with respect to each arm of the power conversion device. Each of the drive circuits 420 drives a switching element included in the corresponding arm. For example, in an example shown in FIG. 2, six drive circuits 420 are provided in order to form up/down arms for three phases. The plurality of drive circuits 420 deals with high-voltage, such as voltage on both end sides of the smooth capacitor C1, which is generated when the motor 5 is driven. Therefore, a region on the surface on the upper side of the board main body 410 in which the plurality of drive circuits 420 is mounted is formed as a high-voltage region.

Insulation-typed drive ICs (Integrated Circuit) 422 are each electrically connected to each of the drive circuits 420. The drive ICs 422 are provided between the micro 600 and the plurality of drive circuits 420.

The power source control circuit 430 is mounted on the surface on the upper side of the board main body 410. The power source control circuit 430 is provided in a low-voltage region R2 on the surface on the upper side of the board main body 410. The low-voltage region R2 is a region that is provided with electronic components that do not deal with high-voltage, such as the voltage on both end sides of the smooth capacitor C1, which is generated when the motor 5 is driven. The power source control circuit 430 supplies electric power to the plurality of drive circuits 420 through the connecting line 500. The power source control circuit 430 includes transistors (not shown in drawing) that drive the plurality of insulation transformers 440. The power source control circuit 430 is common to the plurality of drive circuits 420. The power source control circuit 430 controls electric power supplied to the plurality of drive circuits 420 all together.

The power source control circuit 430 is adjacent to the plurality of drive circuits 420 via an insulation region R1. That is, the insulation region R1 is formed on the surface on the upper side of the board main body 410, and insulates the power source control circuit 430 and the plurality of drive circuits 420 from each other. The insulation region R1 may be a region that has no conductor portion. Perhaps, the insulation region R1 may be formed by a material that has higher CTI (Comparative Tracking Index) than a material used for the board main body 410. The insulation region R1 is formed between the low-voltage region R2 and the high-voltage region (the plurality of drive circuits 420) so as to secure the minimum creepage distance of insulation that is defined by, for example, JIS and the like.

The plurality of insulation transformers 440 is provided so as to correspond to each of the plurality of drive circuits 420. Each of the insulation transformers 440 is disposed on the surface on the upper side of the board main body 410 so as to cross the insulation region R1. That is, each of the insulation transformers 440 is positioned so that a primary side thereof is positioned in the low-voltage region R2 and a secondary side thereof is positioned in the high-voltage region. Each of the insulation transformers 440 links the power source control circuit 430 to the corresponding drive circuit 420 in the insulated state.

The connecting line 500 electrically connects the plurality of insulation transformers 440 and the power source control circuit 430. The connecting line 500 is formed so that at least a part thereof is formed in inner layers of the board main body 410. This structure will be explained later on.

The micro 600 is mounted on the surface on the upper side of the board main body 410. The micro 600 is disposed inside the low-voltage region R2. The micro 600 is electrically connected to each of the plurality of drive circuits 420.

In the example shown in FIG. 2, the micro 600 is electrically connected to each of the plurality of drive circuits 420 by signal lines 602 and 610.

Figure 3:
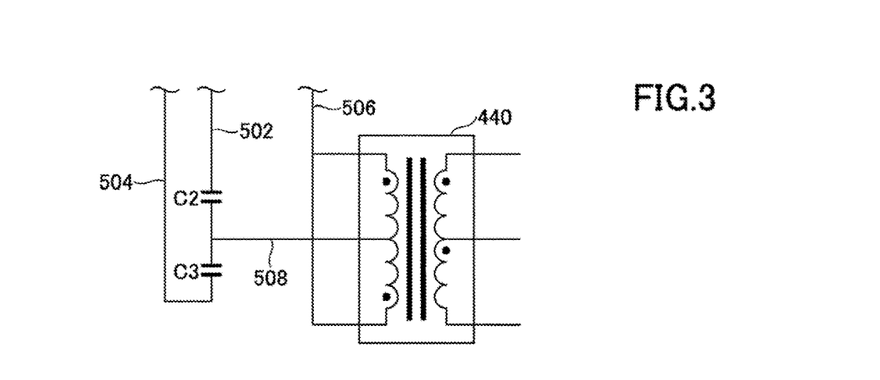
FIG. 3 is a view that shows a part of a circuit including a connecting line related to an insulation transformer.

FIG. 3 is a view that shows a part of the circuit including the connecting line 500 related to the insulation transformers 440. In FIG. 3, although a part of the circuit related to one insulation transformer 440 is shown, the same can be applied to parts of the circuits related to other insulation transformers 440. In an example shown in FIG. 3, the power source control circuit 430 adopts a circuit structure of half-bridge system.

The connecting line 500 is formed by, for example, a conductor pattern. The connecting line 500 includes a first connecting line (hereafter mentioned as "power source connecting line") 502 that is electrically connected to a positive electrode of the power source (power source voltage), a second connecting line (hereafter mentioned as "ground connecting line") 504 that is electrically connected to the ground, a third connecting line (hereafter mentioned as "drive connecting line") 506, and a center tap connecting line 508 that electrically connects between capacitors C2, C3 and a center tap of a transformer on a primary side. A pulse signal that is generated by ON/OFF driving of a transistor controlled by the power source control circuit 430 is transmitted to the drive connecting line 506.

Next, one example of the connecting line 500 will be explained by referring to FIG. 4 to FIG. 6B.

Figure 4:
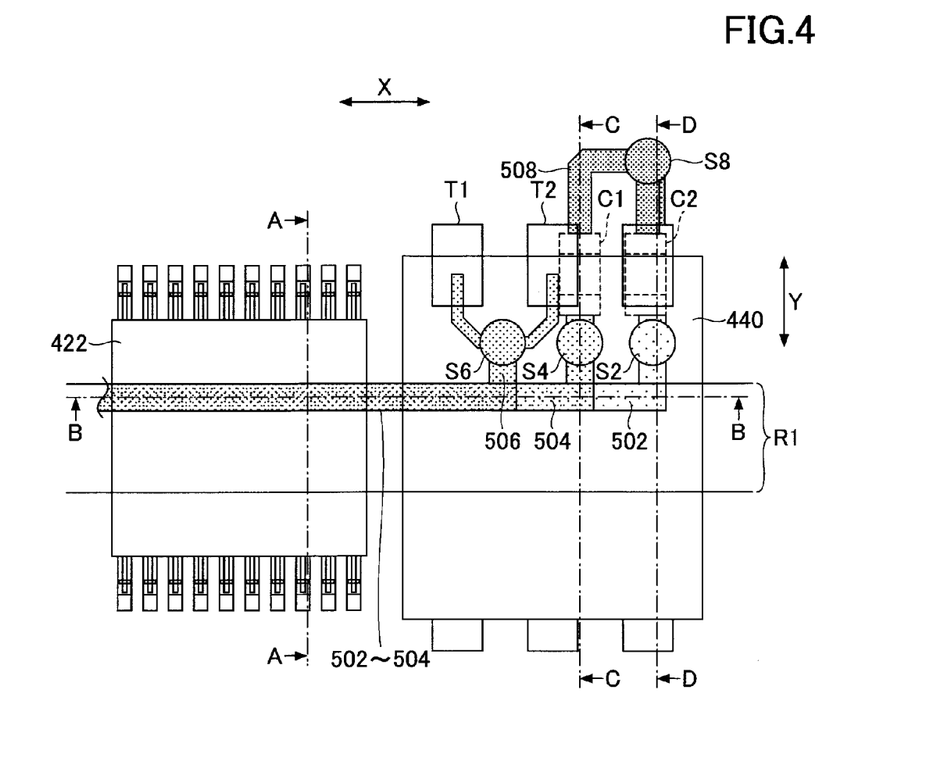
Figure 5A:
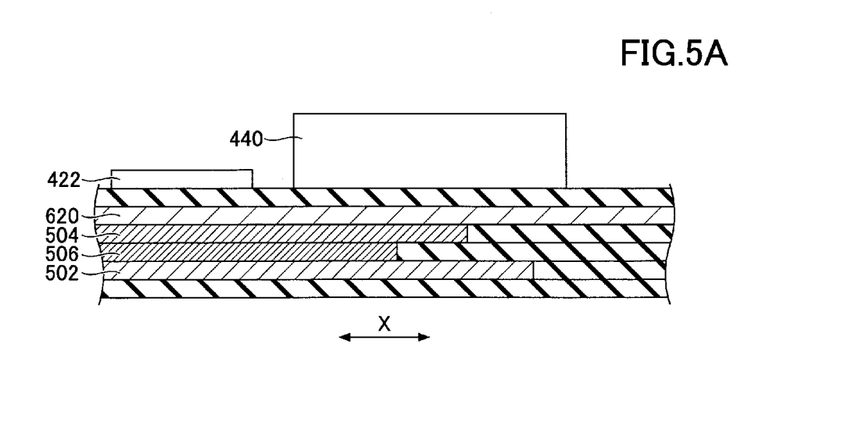
FIG. 5A is a cross-sectional view taken along a line B-B shown in FIG. 4.
Figure 5B:
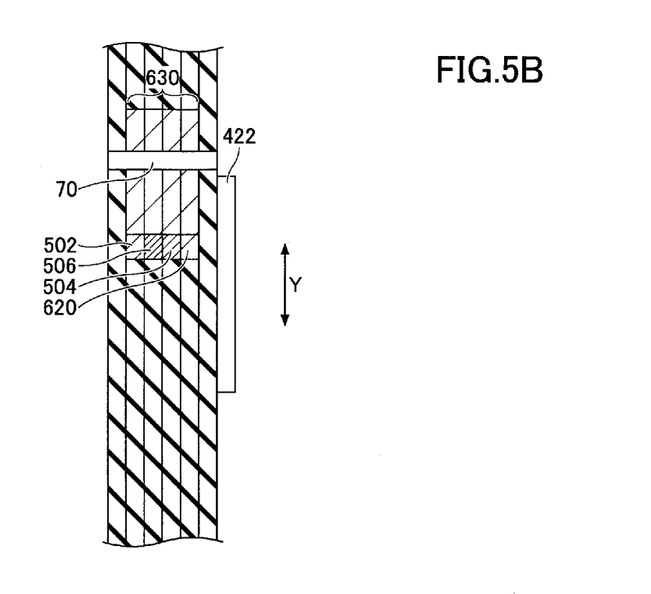
FIG. 5B is a cross-sectional view taken along a line A-A shown in FIG. 4.
Figure 6A:
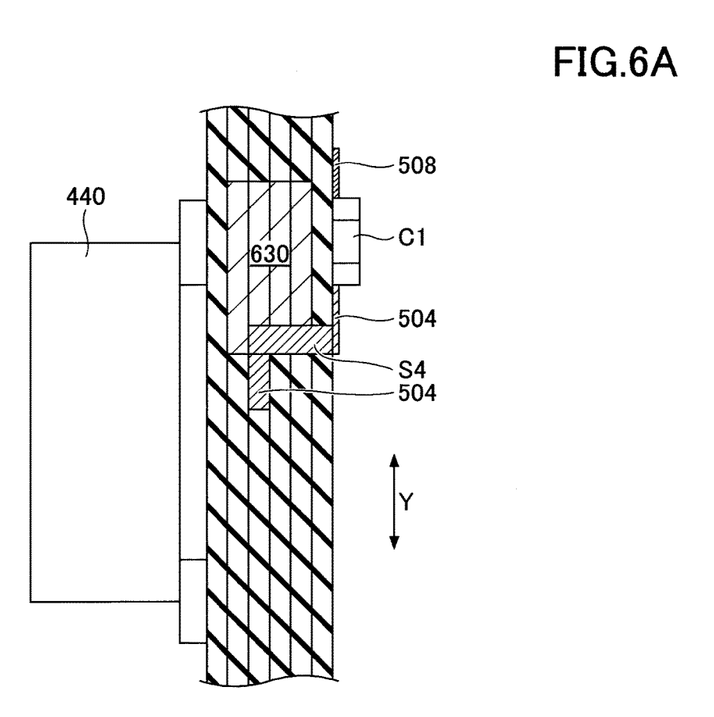
FIG. 6A is a cross-sectional view taken along a line C-C shown in FIG. 4.
Figure 6B:
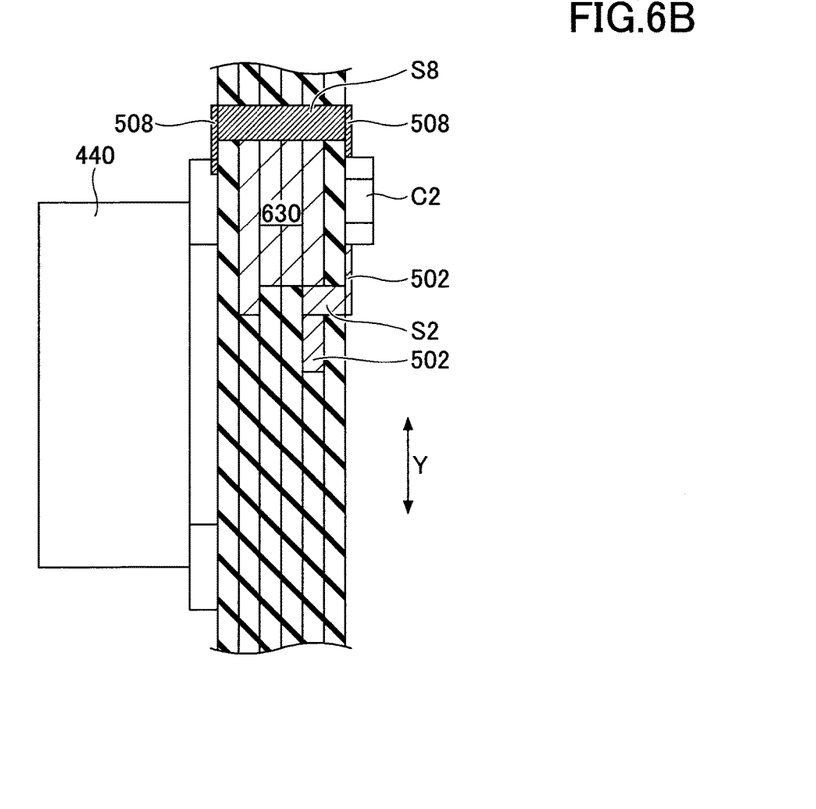
FIG. 6B is a cross-sectional view taken along a line D-D shown in FIG. 4.

FIG. 4 is a perspective view that shows P part of FIG. 2. FIG. 5A and FIG. 5B are cross-sectional views, FIG. 5A is a cross-sectional view taken along a line B-B shown in FIG. 4, and FIG. 5B is a cross-sectional view taken along a line A-A shown in FIG. 4. FIG. 6A and FIG. 6B are cross-sectional views, FIG. 6A is a cross-sectional view taken along a line C-C shown in FIG. 4, and FIG. 6B is a cross-sectional view taken along a line D-D shown in FIG. 4. Moreover, a structure shown in FIG. 4 to FIG. 6B may be substantially the same as structures for parts related to the drive ICs 422 and insulation transformers 440 that are provided in parts other than P part of FIG. 2. Furthermore, the cross-sectional views shown in FIG. 5A and FIG. 5B, and FIG. 6A and FIG. 6B (FIG. 8A and FIG. 8B described later on) are general configurations, and inter-layers (for example, between the power source connecting line 502, the ground connecting line 504 and the drive connecting line 506) are insulated.

As shown in FIG. 4, FIG. 5A and FIG. 5B, the connecting line 500 is formed so that at least a part thereof is formed in the inner layers of the board main body 410. In P part shown in FIG. 4A and FIG. 4B, and FIG. 5A and FIG. 5B, the power source connecting line 502, the ground connecting line 504, and the drive connecting line 506 are formed so that at least a part of each is formed in the inner layers of the board main body 410 in a region that overlaps the insulation region R1 as seen in a direction perpendicular to the surface of the board main body 410 (hereafter, simply mentioned as "surface perpendicular direction"). Hereafter, the region in the inner layers of the board main body 410 that overlaps the insulation region R1 as seen in the surface perpendicular direction is mentioned as the inner layers underneath the insulation region R1.

In the example shown in FIG. 5A and FIG. 5B, the board main body 410 is the multi-layer board including six layers. In the example shown in FIG. 5A and FIG. 5B, the board main body 410 includes, in the inner layers underneath the insulation region R1, a solid pattern 620 electrically connected to the ground in the second layer, the ground connecting line 504 in the third layer, the drive connecting line 506 in the fourth layer, and the power source connecting line 502 in the fifth layer. In this way, the power source connecting line 502, the ground connecting line 504, and the drive connecting line 506 are formed in different layers in a relation in which the drive connecting line 506 is sandwiched between the ground connecting line 504 and the power source connecting line 502 in the surface perpendicular direction.

The power source connecting line 502 and the ground connecting line 504 preferably include portions in which the power source connecting line 502 and the ground connecting line 504 overlap the drive connecting line 506 in the inner layers underneath the insulation region R1 as seen in the surface perpendicular direction. In the example shown in FIG. 4, and FIG. 5A and FIG. 5B, the power source connecting line 502, the ground connecting line 504, and the drive connecting line 506 are formed in the same position in Y direction in the inner layers underneath the insulation region R1. Besides, in the example shown in FIG. 4, and FIG. 5A and FIG. 5B, the power source connecting line 502, the ground connecting line 504, and the drive connecting line 506 are formed with the same line width. Therefore, the power source connecting line 502, the ground connecting line 504, and the drive connecting line 506 overlap each other in the inner layers underneath the insulation region R1 as seen in the surface perpendicular direction (that is, coordinates in X direction and Y direction are the same). However, in the example shown in FIG. 4, and FIG. 5A and FIG. 5B, due to positions of terminals in the insulation transformers 440 and the like, in the inner layers underneath the insulation region R1, the ground connecting line 504 is formed so as to be longer than the drive connecting line 506 in X direction and the power source connecting line 502 is formed so as to be longer than the ground connecting line 504 in X direction, thereby each parts of the power source connecting line 502, the ground connecting line 504, and the drive connecting line 506 do not partially overlap each other. Specifically, due to the positions of the terminals in the insulation transformer 440, the power source connecting line 502, the ground connecting line 504, and the drive connecting line 506 extend in X direction up to positions of corresponding via holes (through holes) S2, S4, and S6 in the inner layers underneath the insulation region R1, and then extend in Y direction toward a region on a low-voltage circuit region side of the inner layers underneath the insulation region R1 so as to be electrically connected to the corresponding via holes (through holes) S2, S4, and S6.

In the region on the low-voltage circuit region side of the inner layers underneath the insulation region R1, the power source connecting line 502, as shown in FIG. 6B, is electrically connected to the capacitor C2 from the via hole S2 on a back surface (B surface) on a lower side of the board main body 410. Moreover, in the region on the low-voltage circuit region side of the inner layers underneath the insulation region R1, the ground connecting line 504, as shown in FIG. 6A, is electrically connected to the capacitor C1 from the via hole S4 on the back surface (B surface) on the lower side of the board main body 410. Furthermore, in the region on the low-voltage circuit region side of the inner layers underneath the insulation region R1, the drive connecting line 506, as shown in FIG. 4, is electrically connected to respective terminals (both ends of the transformer on the primary side) T1 and T2 of the insulation transformers 440 from the via hole S6 on a surface on the upper side of the board main body 410. In addition, the center tap connecting line 508, as shown in FIG. 4, FIG. 6A and FIG. 6B, is achieved by respective patterns that are connected via a via hole S8 and that are formed on both surfaces of the board main body 410.

According to the example shown in FIG. 4 to FIG. 6B, as mentioned above, the connecting line 500 is formed so that a part thereof is formed in the inner layers of the board main body 410. Thereby, the noise generated from the drive connecting line 506 can be prevented from being emitted to the outside of the board main body 410. Besides, as mentioned above, the connecting line 500 is formed so that a part thereof is formed in the inner layers underneath the insulation region R1. The inner layers underneath the insulation region R1 is a region that is not utilized for wiring normally (so-called a dead space), it is therefore possible to effectively achieve the connecting line 500 by utilizing the region. As a result, a part occupied by the connecting line 500 can be reduced on both surfaces of the board main body 410, which makes it possible to reduce the board main body 410 in size.

In the example shown in FIG. 4 to FIG. 6B, the power source connecting line 502, the ground connecting line 504, and the drive connecting line 506 are formed adjacent to the inner layers underneath the low-voltage region in the inner layers underneath the insulation region R1, and are not formed in the inner layers underneath the low-voltage region within a range in X direction up to the corresponding via holes S2, S4, and S6. Thereby, it is possible to form other signals, via holes as the countermeasure for the noise, and the like in the inner layers underneath the low-voltage region. In the example shown in FIG. 4 to FIG. 6B, as shown in FIG. 5A and FIG. 5B, the solid pattern 630 and the via hole 70 as the countermeasure for the noise are formed in the inner layers underneath the low-voltage region. Thereby, the noise generated from the drive connecting line 506 is shielded in Y direction, which makes it possible to prevent the noise from being emitted to the outside. The solid pattern 630 may be insulated from the power source connecting line 502, the ground connecting line 504, and the drive connecting line 506 in each layer. A part in the second layer of the solid pattern 630 may be formed integrally with a solid pattern 620.

According to the example shown in FIG. 4 to FIG. 6B, as mentioned above, the power source connecting line 502, the ground connecting line 504, and the drive connecting line 506 are formed in different layers in a relation in which the drive connecting line 506 is sandwiched by the ground connecting line 504 and the power source connecting line 502 in the surface perpendicular direction. Thereby, the noise generated from the drive connecting line 506 is shielded by the ground connecting line 504 and the power source connecting line 502 in up/down direction, which makes it possible to prevent the noise from being emitted to the outside.

According to the example shown in FIG. 4 to FIG. 6B, as mentioned above, the ground connecting line 504 having a large shielding effect is formed so as to be close to the surface on the upper side of the board main body 410, it is thereby possible to effectively reduce an influence of the noise on electronic components (for example, the micro 600 and the like) mounted on the surface on the upper side of the board main body 410. Besides, according to the example shown in FIG. 4 to FIG. 6B, as mentioned above, the solid pattern 620 having a large shielding effect is further formed in an inner layer that is closer to the surface on the upper side of the board main body 410 than the drive connecting line 506, it is thereby possible to further effectively reduce the influence of the noise on the electronic components mounted on the surface on the upper side of the board main body 410.

In a case in which an electronic component that is likely to be influenced by the noise is mounted on the surface on the lower side of the board main body 410, such a disposition may be in a reverse manner in respect of upper/lower side. Moreover, in a case in which there is no need to concern about the influence of the noise on the lower side of the board main body 410, the power source connecting line 502 may be formed in an inner layer that is closer to the surface on the upper side of the board main body 410 than the drive connecting line 506.

In addition, although the board main body 410 is a board including six layers in the example shown in FIG. 4 to FIG. 6B, the board main body 410 may be a board including more than eight layers, or may be a board including four layers. For example, in case of four layers, in the inner layers underneath the insulation region R1, the ground connecting line 504 is formed in the second layer, the drive connecting line 506 is formed in the third layer, and the power source connecting line 502 is formed in the fourth layer. Thereby, it is possible to obtain the same effect.

Next, an example of the inner layers underneath the insulation region R1 being utilized for wiring of a signal line 610 will be explained by referring to FIG. 7, and FIG. 8A and FIG. 8B.

Figure 7:
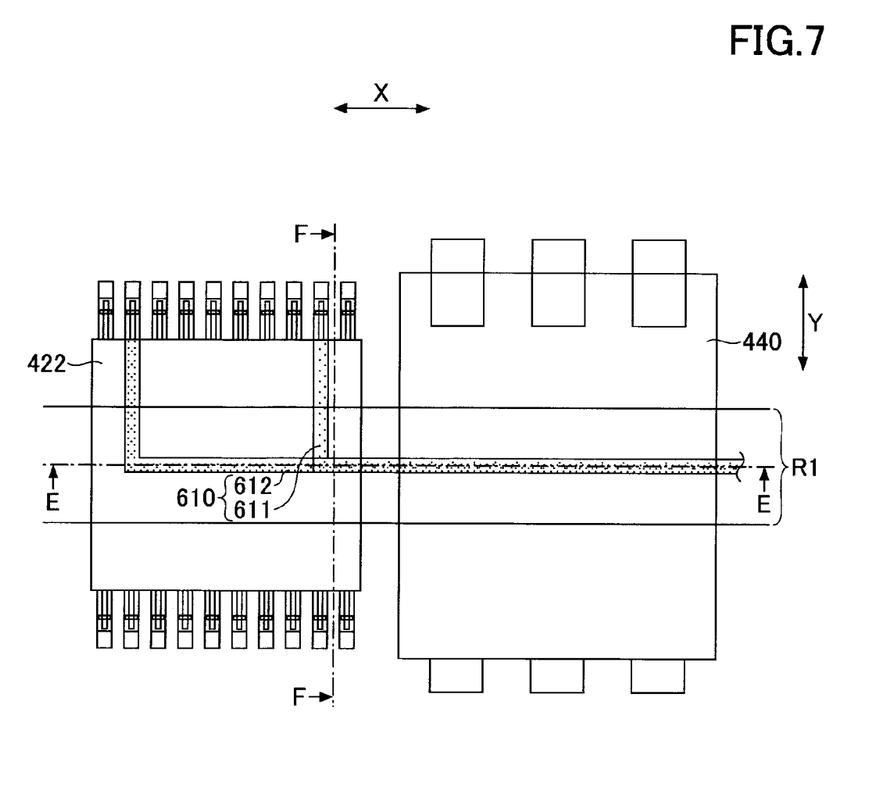

FIG. 7 is a perspective view that shows Q part of FIG. 2. FIG. 8A and FIG. 8B are cross-sectional views, FIG. 8A is a cross-sectional view taken along a line E-E shown in FIG. 7, and FIG. 8B is a cross-sectional view taken along a line F-F shown in FIG. 7. Besides, in FIG. 7, showing the connecting line 500 and the capacitors C2 and C3 in drawings are omitted on account of easiness in seeing.

The signal line 610 is formed by, for example, the conductive pattern. The signal line 610 electrically connects the drive IC 422 to the micro 600. Besides, in FIG. 7, although the signal line 610 is shown only with respect to one drive IC 422 (drive IC 422 in the left-bottom part), the signal line 610 may be provided in other drive ICs 422 in the same manner.

A detection signal showing a detection result of a state of a switching element of the inverter 4 is transmitted to the signal line 610. The detection signal is generated in the drive IC 422. A switching element which is targeted to detect a state is a switching element that is controlled by the drive IC 422 related to the signal line 610 among the switching elements Q1 to Q6. In the example shown in FIG. 7, and FIG. 8A and FIG. 8B, the signal line 610 includes a first signal line 611 to which an abnormal detection signal (weak current signal) is transmitted, the abnormal detection signal showing a detection result of a state in which the switching element is abnormal, and a second signal line 612 to which a temperature signal (analog signal) is transmitted, the temperature signal showing a detection result of a temperature of the switching element.

Figure 8A:
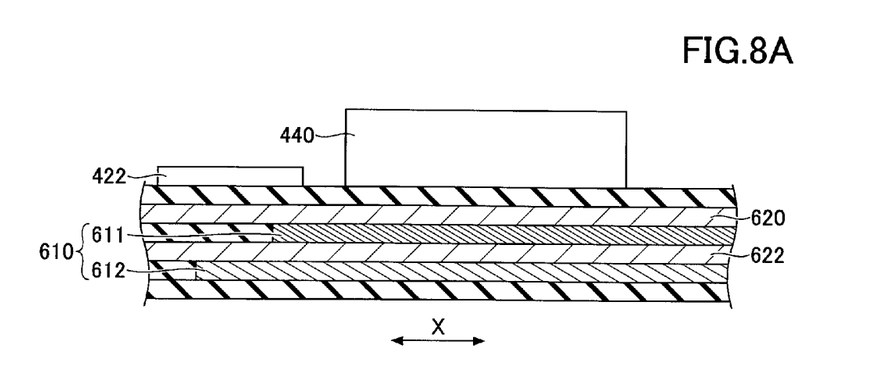
FIG. 8A is a cross-sectional view taken along a line E-E shown in FIG. 7.
Figure 8B:
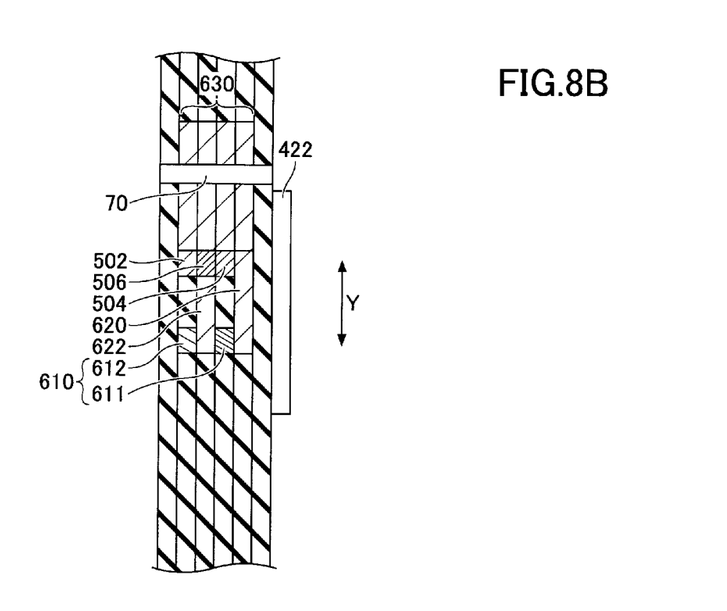
FIG. 8B is a cross-sectional view taken along a line F-F shown in FIG. 7.

As shown in FIG. 7, and FIG. 8A and FIG. 8B, the signal line 610 is formed so that at least a part thereof is formed in the inner layers of the board main body 410. In Q part shown in FIG. 7, and FIG. 8A and FIG. 8B, the first signal line 611 and the second signal line 612 are formed so that at least a part of the first signal line 611 and the second signal line 612 is formed in a region (the inner layers underneath the insulation region R1) in the inner layers of the board main body 410 that overlaps the insulation region R1 as seen in the surface perpendicular direction.

In the example shown in FIG. 7, and FIG. 8A and FIG. 8B, the board main body 410 includes, in the inner layers underneath the insulation region R1, the solid pattern 620 that is electrically connected to the ground in the second layer, the first signal line 611 in the third layer, the solid pattern 622 in the fourth layer, and the second signal line 612 in the fifth layer. Thereby, the first signal line 611 and the second signal line 612 are formed in different layers. Besides, the first signal line 611 and the second signal line 612 are connected to the drive IC 422 through the via hole (not shown in drawing).

The first signal line 611 and the second signal line 612 preferably include portions overlapping the solid patterns 620 and 622 in the inner layers underneath the insulation region R1 as seen in the surface perpendicular direction. In the example shown in FIG. 7, and FIG. 8A and FIG. 8B, the first signal line 611 and the second signal line 612 overlap the solid patterns 620 and 622 substantially over the entire length in the inner layers underneath the insulation region R1 as seen in the surface perpendicular direction.

According to the example shown in FIG. 7, and FIG. 8A and FIG. 8B, as mentioned above, the first signal line 611 and the second signal line 612 are formed so that at least parts thereof are formed in the inner layers of the board main body 410. Thereby, the influence on the first signal line 611 and the second signal line 612 due to the noise generated outside the board main body 410 can be reduced. Moreover, as mentioned above, the first signal line 611 and the second signal line 612 are formed so that at least parts thereof are formed in the inner layers underneath the insulation region R1. The inner layers underneath the insulation region R1 is a region that is not utilized for wiring normally (so-called a dead space), it is thereby possible to effectively achieve the signal line 610 by utilizing the region. As a result, a part occupied by the signal line 610 can be reduced on both surfaces of the board main body 410, which makes it possible to reduce the board main body 410 in size.

In the example shown in FIG. 7, and FIG. 8A and FIG. 8B, the first signal line 611 and the second signal line 612, as shown in FIG. 8B, are formed in the different layers from the drive connecting line 506. In addition, the first signal line 611 and the second signal line 612, as shown in FIG. 8B, are disposed so as to be apart from the drive connecting line 506 in Y direction. That is, the first signal line 611 and the second signal line 612 are formed so as to be adjacent to the inner layers underneath the high-voltage region in the inner layers underneath the insulation region R1. Thereby, the influence on the first signal line 611 and the second signal line 612 due to the noise generated from the drive connecting line 506 can be reduced.

In the example shown in FIG. 7, and FIG. 8A and FIG. 8B, although the signal line 610 is a different line from the signal line 602, the signal line 602 may be formed in the same manner as the signal line 610. Like this, the inner layers underneath the insulation region R1 may be utilized only for wiring of the above-mentioned connecting line 500, however, it is also possible to be utilized for other wiring.

Although each of the embodiments has been discussed in detail above, the present disclosure is not limited to specific embodiments, and a variety of modifications and changes may be made without departing from the scope of the disclosure. In addition, all or a plurality of the constituent elements according to the embodiments discussed earlier may be combined with each other.

For example, in the example shown in FIG. 4 to FIG. 6B, as a preferable embodiment, the ground connecting line 504 is formed in an inner layer that is closer to the surface on the upper side of the board main body 410 than the drive connecting line 506, however, the ground connecting line 504 and the power source connecting line 502 may be formed in an upside down manner. That is, the ground connecting line 504 may be formed in the fifth layer, the power source connecting line 502 may be formed in the third layer. Besides, the solid pattern 620 and/or the solid pattern 630, and/or the via hole 70 may be omitted.

In the example shown in FIG. 4 to FIG. 6B, although the power source connecting line 502, the ground connecting line 504, and the drive connecting line 506 are formed in the different layers, as a preferable embodiment, they may be partially formed in the same inner layer. For example, in a case in which the solid pattern 620 exists, the ground connecting line 504 and the drive connecting line 506 may be formed in the same inner layer so as to be apart from each other in Y direction.

In the above-mentioned embodiment, although the power source control circuit 430 may adopt a circuit structure of half-bridge system, other system (for example, a push-pull system) may be adopted. In case of the push-pull system, the power source connecting line 502 may be formed in an inner layer that is closer to the surface on the upper side of the board main body 410 than two drive connecting lines corresponding to two transistors.

In the above-mentioned embodiment, although the connecting line 500 is formed without utilizing the inner layers underneath the low-voltage region R2, a part of the connecting line 500 may be formed in the inner layers underneath the low-voltage region R2. For example, a part 90 (see FIG. 1) of the connecting line 500 that extends in Y direction toward the power source control circuit 430 may be formed in the inner layers underneath the low-voltage region R2. Besides, for example, in the cross-sectional view shown in FIG. 5B, the connecting line 500 (the power source connecting line 502, and the like) may be formed in a style (the style in which the connecting line 500 extends up to the inner layers underneath the low-voltage region R2) that substitutes a part of the solid pattern 630 (the part adjacent to the inner layers underneath the low-voltage region R2).

In the above-mentioned embodiment, although the connecting line 500 is formed in the inner layers underneath the insulation region R1 so as to be adjacent to the inner layers underneath the low-voltage region, the connecting line 500 may be also formed in the inner layers underneath the insulation region R1 so as to be adjacent to the inner layers underneath the high-voltage region.

In the above-mentioned embodiment, a component for controlling the inverter 4 is mounted on the control board 400, however, a component to be mounted is not limited to the component for controlling the inverter 4. For example, in a case in which the DC-DC converter (another example of the power conversion device) is provided between the smooth capacitor C1 and the battery 2, a component for controlling the DC-DC converter can be mounted on the control board 400, instead of or in addition to the component for controlling the inverter 4.

In the above-mentioned embodiment, although a single power source control circuit 430 that is common to six drive circuits 420 is provided, a plurality of the power source control circuits 430 may be provided as long as a single power source control circuit 430 that is common to more than two drive circuits 420 exists. For example, two power source control circuit 430 in total may be provided, in such a manner that one power source control circuit 430 is provided for three drive circuits 420 that are on one side in Y direction, and other power source control circuit 430 is provided for three drive circuits 420 that are on the other side in Y direction.

In relation to the above-mentioned embodiments, followings will be further disclosed.

(1)

A control board 400 of a power conversion device (4) includes:

a board main body 410 that is a multi-layer board;

a plurality of drive circuits 420 that is mounted on a surface of the board main body 410, each of which is provided with respect to each of arms of the power conversion device (4), and that drives a switching elements included in the corresponding arm;

a power source control circuit 430 that is mounted on the surface of the board main body 410, an insulation region R1 that is formed on the surface of the board main body 410, and that insulates the power source control circuit 430 and the plurality of drive circuits 420 from each other;

a plurality of insulation transformers 440, each of which is provided with respect to each of the plurality of drive circuits 420, that is disposed on the surface of the board main body 410 so as to cross the insulation region R1 and that each connects the power source control circuit 430 and the corresponding drive circuit 420 to each other in an insulated state; and a connecting line 500 that electrically connects the plurality of insulation transformers 440 and the power source control circuit 430 to each other, and at least a part of which extends in a region in inner layers of the board main body 410 that overlaps the insulation region R1 when viewed in a perpendicular direction with respect to the surface of the board main body 410.

According to a structure described in (1), the connecting line 500 is formed so that at least a part thereof is formed in the inner layers of the board main body 410. Thereby, the noise generated from the connecting line 500 can be prevented from being emitted to the outside of the board main body 410. The connecting line 500 is formed so that at least a part thereof is formed in a region (the inner layers underneath the insulation region R1) in the inner layers of the board main body 410 that overlaps the insulation region R1 when viewed in the perpendicular direction with respect to the surface of the board main body 410. The inner layers underneath the insulation region R1 is a region that is not utilized for wiring normally (so-called a dead space), it is therefore possible to effectively achieve the connecting line 500 by utilizing the region. As a result, a part occupied by the connecting line 500 can be reduced on both surfaces of the board main body 410, which makes it possible to reduce the board main body 410 in size.

(2)

The control board 400 of the power conversion device 4) according the description in (1), wherein the connecting line 500 includes a first connecting line (502) that is electrically connected to a positive electrode of a power source, a second connecting line (504) that is electrically connected to a ground, and a third connecting line (506) that is electrically connected to a transistor included in the power source control circuit 430, and in the region in inner layers of the board main body 410 that overlaps the insulation region R1 when viewed in the perpendicular direction with respect to the surface of the board main body 410, the first connecting line (502), the second connecting line (504), and the third connecting line (506) are formed in different layers, with a relation in which the third connecting line (506) is sandwiched between the first connecting line (502) and the second connecting line (504) in the perpendicular direction with respect to the surface of the board main body 410.

According to a structure described in (2), the noise generated from the third connecting line (506) to which the drive signal (pulse signal) of the transistor is transmitted can be prevented from being emitted to the outside of the board main body 410. In addition, since the third connecting line (506) is sandwiched between the first connecting line (502) and the second connecting line (504) in the perpendicular direction with respect to the surface of the board main body 410, the noise generated from the third connecting line (506) can be shielded by the first connecting line (502) and the second connecting line (504), thereby the noise generated from the third connecting line (506) can be further prevented from being emitted to the outside of the board main body 410.

(3)

The control board 400 of the power conversion device (4) according the description in (2), wherein in the region in the inner layers of the board main body 410 that overlaps the insulation region R1 when viewed in the perpendicular direction with respect to the surface of the board main body 410, the second connecting line (504) is formed in a layer that is closer to the surface of the board main body 410 on which the power source control circuit 430 is mounted than the first connecting line (502) and the third connecting line (506) on a side.

According to a structure described in (3), the second connecting line (504) having an large shielding effect because of being electrically connected to the ground is formed in a layer that is close to the board main body 410 on a side on which the power source control circuit 430 is mounted, it is thereby possible to reduce the influence on the power source control circuit 430 due to the noise generated from the third connecting line (506).

(4)

The control board 400 of the power conversion device (4) according the description in (2) or (3), wherein in the region in the inner layers of the board main body 410 that overlaps the insulation region R1 when viewed in the perpendicular direction with respect to the surface of the board main body 410, the first connecting line (502) and the second connecting line (504) include portions that overlap the third connecting line (506) when viewed in the perpendicular direction with respect to the surface of the board main body 410.

According to a structure described in (4), the noise generated from the third connecting line (506) can be shielded by the first connecting line (502) and the second connecting line (504) in the perpendicular direction with respect to the surface of the board main body 410, it is thereby possible to further suppress the noise generated from the third connecting line (506) from being emitted to the outside of the hoard main body 410.

(5)

The control board 400 of the power conversion device (4) according any one of descriptions in (1) to (4) further includes a signal line 610 at least a part of which extends to the region in the inner layer of the board main body 410 that overlaps the insulation region R1 when viewed in the perpendicular direction with respect to the surface the board main body 410, and to which a detection signal showing a detection result of a state of the switching elements is transmitted.

According to a structure described in (5), the signal line 610 is formed so that at least a part thereof is formed in the inner layers of the board main body 410. Thereby, it is possible to reduce the influence on the signal line 610 due to the noise generated in outside of the board main body 410.

Besides, the signal line 610 is formed so that a part thereof is formed in the inner layers underneath the insulation region R1. The inner layers underneath the insulation region R1 is a region that is not utilized for wiring normally (so-called a dead space), it is therefore possible to effectively achieve the signal line 610 by utilizing the region. As a result, a part occupied by the signal line 610 can be reduced on both surfaces of the board main body 410, which makes it possible to reduce the board main body 410 in size.

The present international application claims priority to Japanese Patent Application No, 2014-194264 filed Sep. 24, 2014, the entire contents of which are incorporated herein by reference.

The invention claimed is:

1. A control board of a power conversion device, the control board comprising:
    a board main body that is a multi-layer board;
    a plurality of drive circuits that is mounted on a surface of the board main body, each of which is provided with respect to each of arms of the power conversion device, and that drives a switching element included in the corresponding arm;
    a power source control circuit that is mounted on the surface of the board main body;
    an insulation region that is formed on the surface of the board main body, and that insulates the power source control circuit and the plurality of drive circuits from each other;
    a plurality of insulation transformers, each of which is provided with respect to each of the plurality of drive circuits, that is disposed on the surface of the board main body so as to cross the insulation region, and that each connects the power source control circuit and the corresponding drive circuit to each other in an insulated state; and
    a connecting line that electrically connects the plurality of insulation transformers and the power source control circuit to each other, and at least a part of which extends in a region in inner layers of the board main body that overlaps the insulation region when viewed in a perpendicular direction with respect to the surface of the board main body, wherein:
        the connecting line includes a first connecting line that is electrically connected to a positive electrode of a power source, a second connecting line that is electrically connected to a ground, and a third connecting line that is electrically connected to a transistor included in the power source control circuit, and
        in the region in the inner layers of the board main body that overlaps the insulation region when viewed in the perpendicular direction with respect to the surface of the board main body, the first connecting line, the second connecting line, and the third connecting line are formed in different layers, with a relation in which the third connecting line is sandwiched between the first connecting line and the second connecting line in the perpendicular direction with respect to the surface of the board main body.

2. The control board of the power conversion device according to claim 1, wherein
    in the region in the inner layers of the board main body that overlaps the insulation region when viewed in the perpendicular direction with respect to the surface of the board main body, the second connecting line is formed in a layer that is closer to the surface of the board main body on a side on which the power source control circuit is mounted than the first connecting line and the third connecting line.

3. The control board of the power conversion device according to claim 2, wherein
in the region in the inner layers of the board main body that overlaps the insulation region when viewed in the perpendicular direction with respect to the surface of the board main body, the first connecting line and the second connecting line include portions that overlap the third connecting line when viewed in the perpendicular direction with respect to the surface of the board main body.

4. The control board of the power conversion device according to claim 3, further comprising a signal line, at least a part of which extends in the region in the inner layers of the board main body that overlaps the insulation region when viewed in the perpendicular direction with respect to the surface of the board main body, and to which a detection signal showing a detection result of a state of the switching elements is transmitted.

5. The control board of the power conversion device according to claim 2, further comprising a signal line, at least a part of which extends in the region in the inner layers of the board main body that overlaps the insulation region when viewed in the perpendicular direction with respect to the surface of the board main body, and to which a detection signal showing a detection result of a state of the switching elements is transmitted.

6. The control board of the power conversion device according to claim 1, wherein
in the region in the inner layers of the board main body that overlaps the insulation region when viewed in the perpendicular direction with respect to the surface of the board main body, the first connecting line and the second connecting line include portions that overlap the third connecting line when viewed in the perpendicular direction with respect to the surface of the board main body.

7. The control board of the power conversion device according to claim 6, further comprising a signal line, at least a part of which extends in the region in the inner layers of the board main body that overlaps the insulation region when viewed in the perpendicular direction with respect to the surface of the board main body, and to which a detection signal showing a detection result of a state of the switching elements is transmitted.

8. The control board of the power conversion device according to claim 1, further comprising a signal line, at least a part of which extends in the region in the inner layers of the board main body that overlaps the insulation region when viewed in the perpendicular direction with respect to the surface of the board main body, and to which a detection signal showing a detection result of a state of the switching elements is transmitted.

* * * * *